(12) United States Patent
Nakata et al.

(10) Patent No.: US 7,554,480 B2
(45) Date of Patent: Jun. 30, 2009

(54) ANALOG/DIGITAL CONVERTER, ILLUMINANCE SENSOR, ILLUMINATION DEVICE, AND ELECTRONIC DEVICE

(75) Inventors: Yuichiro Nakata, Kyoto (JP); Junji Fujino, Kyoto (JP); Yoshitsugu Uedaira, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1 day.

(21) Appl. No.: 11/775,336

(22) Filed: Jul. 10, 2007

(65) Prior Publication Data
US 2008/0012741 A1 Jan. 17, 2008

(30) Foreign Application Priority Data
Jul. 14, 2006 (JP) .............................. 2006-194422
Jun. 4, 2007 (JP) .............................. 2007-147648

(51) Int. Cl.
*H03M 1/12* (2006.01)
(52) U.S. Cl. ...................... 341/172; 341/155
(58) Field of Classification Search ................. 341/155, 341/172, 108; 382/275; 356/406
See application file for complete search history.

(56) References Cited

U.S. PATENT DOCUMENTS

| | | | | |
|---|---|---|---|---|
| 3,449,741 | A * | 6/1969 | Egerton, Jr. ................. 341/108 |
| 4,178,585 | A * | 12/1979 | Takagi et al. ................. 341/136 |
| 5,959,565 | A * | 9/1999 | Taniuchi et al. .............. 341/172 |
| 5,977,893 | A * | 11/1999 | Chen et al. ................... 341/120 |
| 6,462,819 | B1 * | 10/2002 | Terauchi et al. ............. 356/406 |
| 6,775,419 | B2 * | 8/2004 | Maeda et al. ................ 382/275 |
| 6,813,004 | B1 * | 11/2004 | Horikoshi et al. ............. 355/69 |
| 2004/0070531 | A1 * | 4/2004 | Fujita et al. .................. 341/172 |
| 2005/0046604 | A1 * | 3/2005 | Pentakota et al. ........... 341/172 |

FOREIGN PATENT DOCUMENTS

JP 2001-160756 6/2001

* cited by examiner

*Primary Examiner*—Jean B Jeanglaude
(74) *Attorney, Agent, or Firm*—Fish & Richardson P.C.

(57) ABSTRACT

An analog/digital converter has a charge circuit that has a charge capacitor storing an electric charge commensurate with an input current, and first and second discharge circuits that discharge the electric charge stored in the charge capacitor. While the charge capacitor is charged for a predetermined charge period, every time a predetermined amount of electric charge is stored in the charge capacitor, the electric charge stored there is discharged by the first discharge circuit. After the charge period, the electric charge remaining in the charge capacitor is discharged by the second discharge circuit. Based on the number of discharges performed by the first discharge circuit and the discharge duration of the second discharge circuit, a digital value of the voltage commensurate with the amount of electric charge with which the charge capacitor has been charged is outputted. This offers a wider input dynamic range combined with an enhanced minimum resolution without requiring complicated external control, and in addition allows measurement to be performed in less time.

12 Claims, 8 Drawing Sheets

FIG. 3

| OPERATION MODE | SW1 | SW2 | SW3a SW3b | SW4a SW4b | SW5a SW5b | SW6a SW6b |
|---|---|---|---|---|---|---|
| A | ON | OFF | OFF | ON | OFF | ON |
| B | ON | OFF | ON | OFF | OFF | ON |
| C | OFF | OFF | OFF | ON | ON | OFF |
| D | OFF | OFF | OFF | ON | OFF | ON |
| E | OFF | ON | OFF | ON | OFF | ON |

ANALOG/DIGITAL CONVERTER, ILLUMINANCE SENSOR, ILLUMINATION DEVICE, AND ELECTRONIC DEVICE

CROSS-REFERENCE TO RELATED APPLICATIONS

This application is based on the following Japanese Patent Applications, the contents of which are hereby incorporated by reference:

(1) Japanese Patent Application No. 2006-194422, filed on Jul. 14, 2006; and (2) Japanese Patent Application No. 2007-147648, filed on Jun. 4, 2007.

BACKGROUND OF THE INVENTION

1. Field of the Invention

The present invention relates to analog/digital converters, and also relates to illuminance sensors, illumination devices, and electronic devices employing them. More particularly, the present invention concerns with, in such devices, widening the input dynamic range, enhancing the minimum resolution, and shortening the measurement time.

2. Description of Related Art

As a technology related to analog/digital converters, JP-2001-160756 discloses and proposes an analog/digital converter as shown in FIG. 7, comprising a capacitor for storing an electric charge commensurate with a measurement-target input voltage level, a constant current circuit for discharging the stored electric charge, a counter for counting clock pulses after the start of discharging until the voltage across the capacitor becomes equal to a predetermined level.

Certainly, with the conventional analog/digital converter mentioned above, it is possible to achieve, with a simple configuration, analog/digital conversion processing of a measurement-target input voltage level.

Inconveniently, however, with the conventional analog/digital converter mentioned above, the higher the measurement-target input voltage, the longer it takes to discharge the capacitor, and thus the longer the conversion time required.

Increasing the current level through the constant current circuit may shorten the time needed to discharge the capacitor, but doing so necessitates, to maintain the minimum resolution of conversion, increasing the frequency of the clock.

On the other hand, in the field of illuminance sensors, there is conventionally adopted a configuration as shown in FIG. 8, comprising photodiodes PDa and PDb with different photo-detective characteristics (spectral sensitivity), wherein photoelectric conversion processing is performed on a time-division basis and, after the output current from each of the photodiodes PDa and PDb is processed by analog/digital conversion processing, the difference between the two currents is calculated to measure the targeted wavelength alone.

One disadvantage with the conventional configuration mentioned above is that a calculation circuit needs to be provided separately, leading to an increased circuit scale.

Another disadvantage with the conventional configuration mentioned above is that the output currents from the photodiodes PDa and PDb are fed directly to an integrating operational amplifier without their difference being calculated beforehand, resulting in a narrow input dynamic range.

Still other disadvantages with the conventional configuration mentioned above are that, since photoelectric conversion with the photodiodes PDa and PDb is performed on a time-division basis, measurement takes twice as much time as with a single photodiode, and that a variation in illuminance between during measurement with the photodiode PDa and during measurement with the photodiode PDb produces an inaccurate calculation result.

These disadvantages may be overcome by completely separately providing an analog/digital converter for the photodiode PDa and an analog/digital converter for the photodiode PDb, but doing so doubles the circuit scale, quite disadvantageously for application in, for example, portable devices.

SUMMARY OF THE INVENTION

A first object of the present invention is to provide an analog/digital converter that offers a wider input dynamic range combined with an enhanced minimum resolution without requiring complicated external control and that in addition operates with a shorter measurement time, and to provide an illuminance sensor, an illumination device, and an electronic device employing such an analog/digital converter.

A second object of the present invention is to provide an illuminance sensor that can measure a target wavelength alone accurately with no increase in circuit scale or in measurement time, and to provide an illumination device and an electronic device employing such an illuminance sensor.

To achieve the above objects, according to one aspect of the present invention, an analog/digital converter is provided with: a charge circuit that has a charge capacitor storing an electric charge commensurate with an input current; and first and second discharge circuits that discharge the electric charge stored in the charge capacitor. Here, while the charge capacitor is charged for a predetermined charge period, every time a predetermined amount of electric charge is stored in the charge capacitor, the electric charge stored there is discharged by the first discharge circuit. After the charge period, the electric charge remaining in the charge capacitor is discharged by the second discharge circuit. Then, based on the number of discharges performed by the first discharge circuit and the discharge duration of the second discharge circuit, the analog/digital converter outputs a digital value of the voltage commensurate with the amount of electric charge with which the charge capacitor has been charged.

Other features, elements, steps, advantages and characteristics of the present invention will become more apparent from the following detailed description of preferred embodiments thereof with reference to the attached drawings.

BRIEF DESCRIPTION OF THE DRAWINGS

FIG. 3 is a matrix diagram showing the states of switches in operation modes A-E;

DETAILED DESCRIPTION OF PREFERRED EMBODIMENTS

Hereinafter, the present invention will be described by way of an example in which an analog/digital converter according to the invention is employed in an illuminance sensor.

Figure 1:
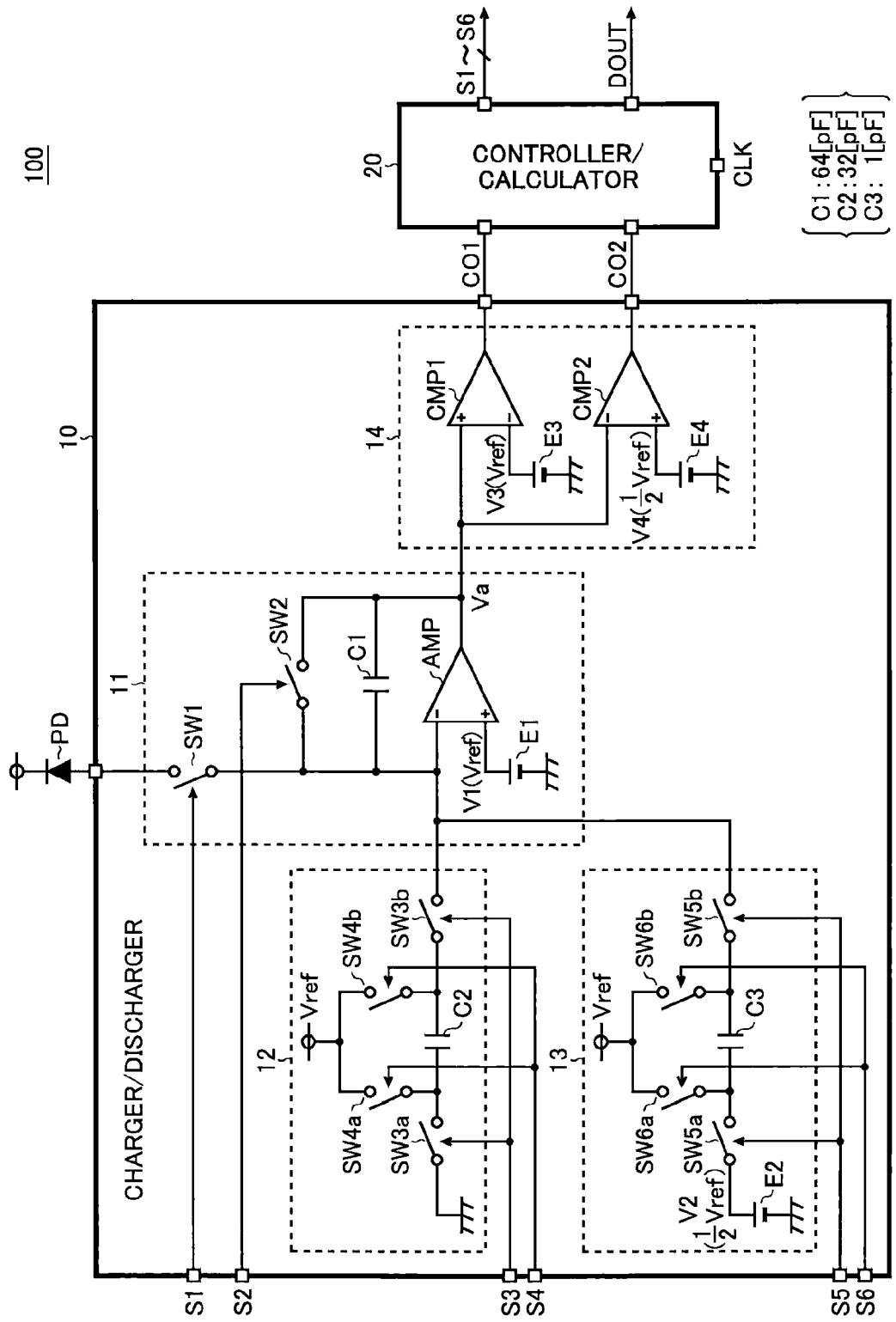
FIG. 1 is a circuit diagram showing an illumination sensor according to the invention, as a first embodiment.

FIG. 1 is a circuit diagram showing an illuminance sensor according to the invention, as a first embodiment.

As shown in FIG. 1, the illuminance sensor 100 of this embodiment includes: a photodiode PD that converts measurement-target light into an electric current; and an analog/digital converter (a charger/discharger 10 and a controller/calculator 20) that receives, as an input current to it, the output of the photodiode PD. Thus, the illuminance sensor 100 yields a digital output according to illuminance.

The charger/discharger 10 includes a charge circuit (integrating operational amplifier) 11, a first discharge circuit 12, a second discharge circuit 13, and a comparison circuit 14.

The charge circuit 11 stores an electric charge according to an input current (the detection current from the photodiode PD) for a predetermined charge period. The charge circuit 11 includes: an operational amplifier AMP; a charge capacitor C1 (in this embodiment, with a capacitance of 64 pF) of which a first end is connected to the inverting input terminal (−) of the operational amplifier AMP and of which a second end is connected to the output terminal of the operational amplifier AMP; a first constant voltage source E1 that applies a predetermined voltage (in this embodiment, equal to a reference voltage Vref) a first standard voltage V1 to the non-inverting input terminal (+) of the operational amplifier AMP; a first switch SW1 that opens and closes the path between an input current input node (i.e., the anode of the photodiode PD) and the first end of the charge capacitor C1 according to a control signal S1; and a second switch SW2 that short-circuits across the charge capacitor C1 according to a control signal S2.

The first discharge circuit 12 discharges the electric charge stored in the charge circuit 11 every time the amount of electric charge there reaches a predetermined threshold level during the above-mentioned charge period. The first discharge circuit 12 includes: a first discharge capacitor C2 (with a capacitance 1/m (m>1) as high as that of the charge capacitor C1; specifically, in this embodiment, 32 pF); third switches SW3a and SW3b that respectively open and close the path between one end of the first discharge capacitor C2 and a grounded node and the path between the other end of the first discharge capacitor C2 and the inverting input terminal (−) of the operational amplifier AMP according to a control signal S3; and fourth switches SW4a and SW4b that respectively open and close the paths between each end of the first discharge capacitor C2 and a node to which the reference voltage Vref is applied according to a control signal S4.

At the end of the above-mentioned charge period, the second discharge circuit 13 discharges the electric charge remaining in the charge circuit 11 until it decreases to a predetermined level; the second discharge circuit 13 does so with a smaller-scale discharging ability than the first discharge circuit 12 and in steps, discharging a predetermined amount of electric charge in each step. The second discharge circuit 13 includes a second discharge capacitor C3 (with a capacitance 1/n (n>m) as high as that of the charge capacitor C1; specifically, in this embodiment, 1 pF); a second constant voltage source E2 that generates a second standard voltage V2 (a voltage 1/k (k>1) as high as the first standard voltage V1; specifically, in this embodiment, equal to Vref/2); fifth switches SW5a and SW5b that respectively open and close the path between one end of the second discharge capacitor C3 and the positive terminal of the second constant voltage source E2 and the path between the other end of the second discharge capacitor C3 and the inverting input terminal (−) of the operational amplifier AMP according to a control signal S5; and sixth switches SW6a to SW6b that respectively open and close the paths between each end of the second discharge capacitor C3 and a node to which the reference voltage Vref is applied according to a control signal S6.

The comparison circuit 14 compares the output voltage Va of the operational amplifier AMP with, on one hand, a third standard voltage V3 (in this embodiment, equal to the reference voltage Vref1 and with, on the other hand, a fourth standard voltage V4 (in this embodiment, equal to Vref/2). The comparison circuit 14 includes: a third constant voltage source E3 that generates the third standard voltage V3; a fourth constant voltage source E4 that generates the fourth standard voltage V4; a first comparator CMP1 of which the non-inverting input terminal (+) is connected to the output terminal of the operational amplifier AMP and of which the inverting input terminal (−) is connected to the positive terminal of the third constant voltage source E3; and a second comparator CMP2 of which the inverting input terminal (−) is connected to the output terminal of the operational amplifier AMP and of which the non-inverting input terminal (+) is connected to the positive terminal of the fourth constant voltage source E4.

The controller/calculator 20 generates the control signals S1 to S6 based on a predetermined clock signal CLK and the respective output signals CO1 and CO2 of the comparators CMP1 and CMP2, in order to control the charging and discharging of the charge circuit 11 and the discharge circuits 12 and 13; the controller/calculator 20 also calculates the total charge amount of the charge circuit 11 based on the total number of discharges performed by the discharge circuits 12 and 13, in order to yield a digital output DOUT that reflects the calculation result.

Now the operation of the illuminance sensor 100 (in particular the charging/discharging operation of the charger/discharger 10) will be described in more detail with reference to FIGS. 2 and 3.

Figure 2:
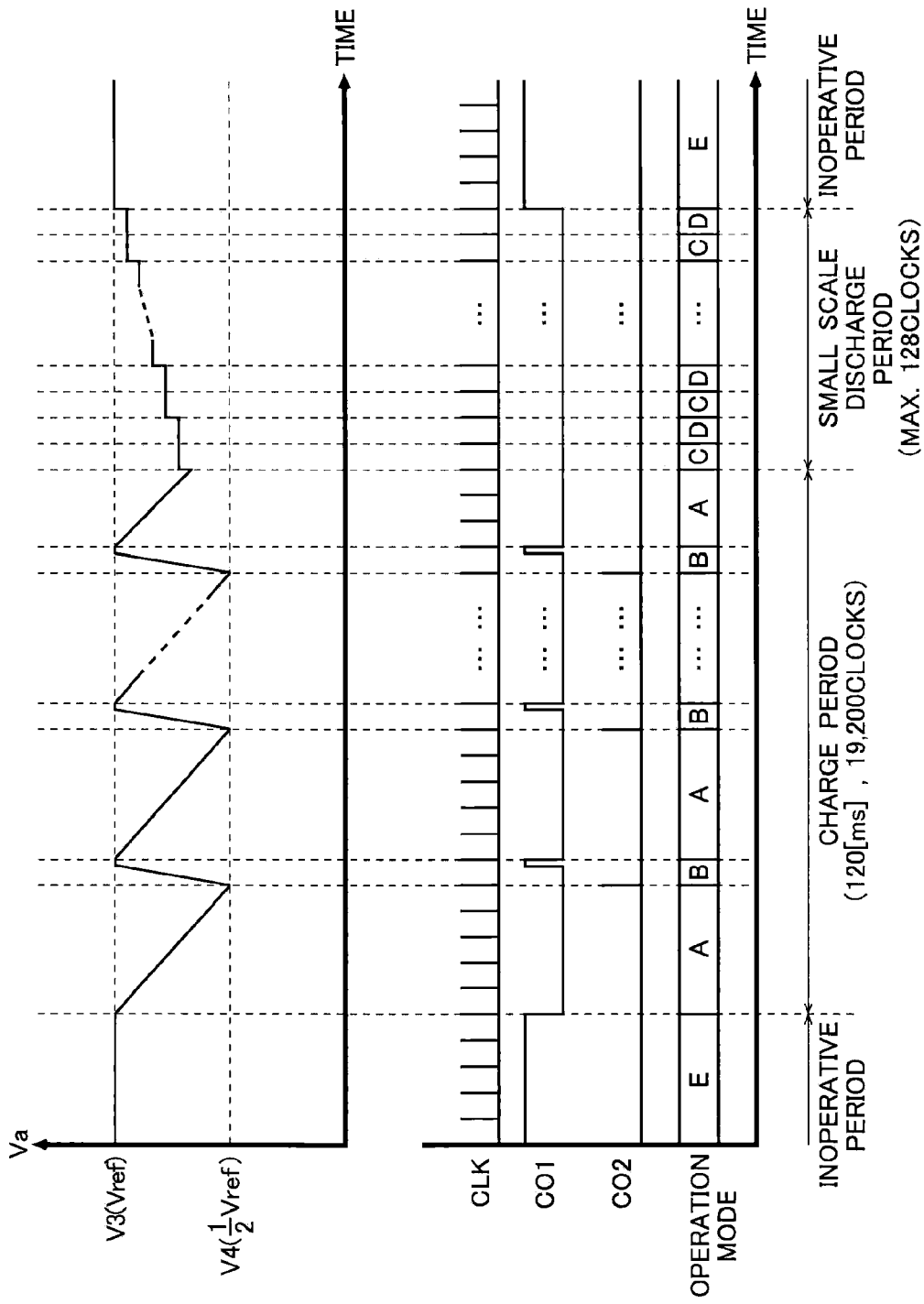
FIG. 2 is a timing chart showing an example of charging/discharging operation.

FIG. 2 is a timing chart showing an example of the charging/discharging operation of the charger/discharger 10, and FIG. 3 is a matrix table showing the states of the switches in operation modes A to E. In the upper part of FIG. 2 is shown the variation with time of the output voltage Va of the operational amplifier AMP; in the lower part of FIG. 2 is shown the variation with time of the clock signal CLK, of the output signals CO1 and CO2 of the comparators CPM1 and CMP2, and of the operation mode.

In a period in which the illuminance sensor 100 is inoperative (inoperative period), the controller/calculator 20 feeds the charger/discharger 10 with control signals S1 to S6 that request operation mode E (inoperative mode). In operation mode E, as shown in FIG. 3, the switch SW1 is off, the switch SW2 is on, the switches SW3a and SW3b are off, the switches SW4a and SW4b are on, the switches SW5a and SW5b are off, and the switches SW6a and SW6b are on. That is, in the operation mode in which the illuminance sensor 100 is inoperative, the current input path from the photodiode PD is disconnected, and the electric charges in the capacitors C1 to C3 are all discharged. Now the output voltage Va of the operational amplifier AMP equals the first standard voltage V1 (the third standard voltage V3).

When a measurement command is received from an unillustrated microcomputer or the like, the controller/calculator 20, with an intent to shift the illuminance sensor 100 into a charge period (measurement period), feeds control signals S1 to S6 that request operation mode A (in which the charge capacitor C1 is charged). In operation mode A, as shown in FIG. 3, the switch SW1 is on, the switch SW2 is off, the switches SW3a and SW3b are off, the switches SW4a and SW4b are on, the switches SW5a and SW5b are off, and the switches SW6a and SW6b are on. That is, in the operation mode in which the charge capacitor C1 is charged, the current input path from the photodiode PD is connected, and the charge capacitor C1 starts to be charged. Now as the charge capacitor C1 is charged, the output voltage Va of the operational amplifier AMP decreases.

When the charge capacitor C1 is charged so far that the output voltage Va of the operational amplifier AMP decreases to the fourth standard voltage V4, the output signal CO2 of the second comparator CMP2, which has hitherto been at low level, turns to high level. On recognizing this logic level change, the controller/calculator 20 feeds control signals S1 to S6 that request operation mode B (in which the charge capacitor C1 is discharged on a large scale). In operation mode B, as shown in FIG. 3, the switch SW1 is on, the switch SW2 is off, the switches SW3a and SW3b are on, the switches SW4a and SW4b are off, and the switches SW5a and SW5b are off, and the switches SW6a and SW6b are on. That is, in the operation mode in which the charge capacitor C1 is discharged on a large scale, the charge transfer path from the capacitor C1 to the capacitor C2 is connected, and thus the electric charge stored in the capacitor C1 is transferred to the capacitor C2.

Here, although the capacitor C2 has one-half the capacitance of the capacitor C1, the voltage across the capacitor C2 is twice that across the capacitor C1; thus the capacitor C1 can store the same amount of electric charge as the capacitor C1. Accordingly, in the operation mode in which the charge capacitor C1 is discharged on a large scale, the electric charge stored in the capacitor C1 is all transferred to the capacitor C2; thus the output voltage Va of the operational amplifier AMP rises up to the first standard voltage V1 (the third standard voltage V3). It should be noted, however, that even in the operation mode in which the charge capacitor C1 is discharged on a large scale, the current input from the photodiode PD (i.e., the charting of the capacitor C1) continues and thus, if the measurement-target light is excessively intense, the output voltage Va of the operational amplifier AMP may not return to the first standard voltage V1 (the third standard voltage V3). As a result, whether or not the output signal C01 of the first comparator CMP1 turns to high level is not always definite; fortunately, however, this causes no major problem because the controller/calculator 20 performs no control based on the output signal C01 when the illuminance sensor 100 is in the charge period.

After the capacitor C1 starts to be discharged on a large scale, at the next rising edge in the clock signal CLK, the controller/calculator 20, with an intent to complete the large-scale discharging of the capacitor C1, feeds, again, control signals S1 to S6 that request operation mode A. Thus, the output voltage Va of the operational amplifier AMP stops increasing and starts to decrease again. Moreover, in operation mode A, concurrently with the charging of the capacitor C1, the capacitor C2 is discharged. Henceforth, every time the amount of electric charge stored in the charge circuit 11 (hence the output voltage Va of the operational amplifier AMP) reaches a predetermined threshold level, the electric charge stored there is discharged on a large scale by the first discharge circuit 12.

After the illuminance sensor 100 is shifted from the inoperative period to the charge period, when the count of the clock signal CLK reaches a predetermined value, the controller/calculator 20 shifts the illuminance sensor 100 into a small-scale discharge period by feeding control signal S1 that request operation mode C (in which the capacitor C1 is discharged on a small scale). In operation mode C, as shown in FIG. 3, the switch SW1 is off, the switch SW2 is off, the switches SW3a and SW3b are off, the switches SW4a and SW4b are on, the switches SW5a and SW5b are on, and the switches SW6a and SW6b are off. That is, in the mode in which the capacitor C1 is discharged on a small scale, the current input path from the photodiode PD is disconnected, and the charge transfer path from the capacitor C1 to the capacitor C3 is connected, so that the electric charge stored in the capacitor C1 is transferred to the capacitor C3.

Here, the capacitance of the capacitor C3 is 1/64 as high as that of the capacitor C1, and the voltage across the capacitor C3 equals that across the capacitor C1 (Vref/2). On the other hand, the capacitance of the capacitor C2 is 1/2 as high as that of the capacitor C1, and the voltage across the capacitor C2 equals twice that across the capacitor C1. Thus, the small-scale discharging ability of the second discharge circuit 13 including the capacitor C3 is set to be 1/64 as high as the large-scale discharging ability of the first discharge circuit 12 including the capacitor C2. Accordingly, in the mode in which the capacitor C1 is discharged on a small scale, of the electric charge remaining in the capacitor C1, only a predetermined proportion (the amount of electric charge corresponding to Vref/128) is transferred to the capacitor C3.

The same discharging abilities as described above can be obtained with a configuration in which the second constant voltage source E2 is omitted and instead the capacitance of the capacitor C3 is set to be 1/128 as high as that of the capacitor C1. For better pair characteristics among the capacitors C1 to C3, however, it is preferable to adopt the configuration specifically described above.

The reason is as follows. When the capacitor C3 has a capacitance of 1 pF, the desired pair characteristics among the capacitors C1 to C3 can be achieved based on capacitors each having a capacitance of 1 pF; specifically, it suffices to form 64 such capacitors as the capacitor C1 and 32 such capacitors as the capacitor C2. In contrast, if the capacitor C3 has a capacitance of 0.5 pF, the desired pair characteristics among the capacitors C1 to C3 need to be achieved based on capacitors each having a capacitance of 0.5 pF; specifically, it is necessary to form as many as 128 such capacitors as the capacitor C1 and as many as 64 such capacitors as the capacitor C2. This leads to disadvantages associated with wiring space and wiring capacitance.

After the capacitor C1 starts to be discharged on a small scale, at the next rising edge in the clock signal CLK, the controller/calculator 20, with an intent to make the electric charge transferred from the capacitor C1 to the capacitor C3 escape, feeds control signals S1 to S6 that request operation mode D (in which the capacitor C3 is discharged). In operation mode D, as shown in FIG. 3, the switch SW1 is off, the switch SW2 is off, the switches SW3a and SW3b are off, the switches SW4a and SW4b are on, the switches SW5a and SW5b are off, and the switches SW6a and SW6b are on. That is, in the mode in which the capacitor C3 is discharged, the charge transfer path form the capacitor C1 to the capacitor C3 is disconnected, and the capacitor C3 is discharged. Henceforth, the electric charge remaining in the charge circuit 11 is discharged by the second discharge circuit 13 until the electric charge there decreases to a predetermined level; here, discharging takes place in steps, discharging a predetermined amount of electric charge on a small scale in each step.

Here, in the period during which the capacitor C1 is discharged on a small scale, transferring electric charge from the capacitor C1 to the capacitor C3 requires one clock cycle, and making the electric charge in the capacitor C3 escape requires one clock cycle. Thus, the small-scale discharge period lasts for 128 clock cycles at the longest.

As the small-scale discharging of the capacitor C1 progresses, when the output voltage Va of the operational amplifier AMP reaches the third standard voltage V3, the output signal CO1 of the first comparator CMP1, which has hitherto been at low level, turns to high level. On recognizing this logic level change, the controller/calculator 20, with an intent to shift the illuminance sensor 100 into an inoperative period, feeds control signals S1 to S6 that request operation mode E. This marks the end of the sequence of charging/discharging operation thus far described.

In addition, the controller/calculator 20 counts the number of large-scale discharges performed by the first discharge circuit 12 (the number of shifts into operation mode B) and the number of small-scale discharges performed by the second discharge circuit 13 (the number of shifts into operation mode C). From the total number of discharges performed, the controller/calculator 20 calculates the total charge amount of the charge circuit 11, and yields a digital output DOUT that reflects the result of the calculation.

As described above, the analog/digital converter of this embodiment includes: a charge circuit 11 that stores an electric charge according to an input current for a predetermined charge period; a first discharge circuit 12 that discharges the electric charge stored in the charge circuit 11 every time the amount of electric charge stored there reaches a predetermined threshold level during the charge period; a second discharge circuit 13 that, at the end of the charge period, discharges the electric charge remaining in the charge circuit 11 until it decreases to a predetermined level, the second discharge circuit 13 doing so with a smaller-scale discharging ability than the first discharge circuit and in steps, discharging a predetermined amount of electric charge in each step; and a controller/calculator 20 that controls the charging and discharging of the charge circuit 11 and the discharge circuits 12 and 13, and that also calculates the total charge amount of the charge circuit 11 based on the total number of discharges performed by the discharge circuits 12 and 13 in order to yield a digital output DOUT that reflects the calculation result.

That is, two discharge circuits 12 and 13 having different discharge abilities are provided so that large-scale and small-scale discharges are performed appropriately, and the number of discharges performed by each of them is counted so that, based on the total number of discharges, the integrated amount of input current is calculated. With this configuration, it is possible to perform coarse measurements by large-scale discharging and then, only finally, perform fine measurements by small-scale discharging. Thus, it is possible to achieve a wider input dynamic range combined with an enhanced minimum resolution without requiring complicated external control, and in addition to shorten the measurement time.

Consider, for example, a case where the charge period is 120 ms, the frequency of the clock signal CLK is 160 kHz (with an oscillation cycle of 6.25 μm), and the ratio of the large-scale discharging by the first discharge circuit 12 to the small-scale discharging by the second discharge circuit 13 is set at 64:1.

Under these conditions, the clock signal CLK fed in during the above-mentioned charge period contains 19,200 pulses, corresponding to as many clock cycles. On the other hand, the maximum measurement level (the upper limit of the input dynamic range) of the illuminance sensor 100 is that which causes the electric charge stored in the capacitor C1 during two clock cycles to be discharged with a single large-scale discharge. If more current is fed in, the output voltage Va simply continues to decrease, making it impossible to perform integrating measurement of the input current level. Here, suppose that a single small-scale discharge (which corresponds to the minimum resolution) is set to correspond to 0.5 lx; then a large-scale discharge corresponds to 32 lx. Accordingly, the maximum measurement level of the illuminance sensor 100 is given as follows: 19,200 (clock cycles)/2 (clock cycles per large-scale discharge)×32 (lx per large-scale discharge)=307,200 (lx).

Thus, with the illuminance sensor 100 of this embodiment, in a measurement period as short as 120 ms, it is possible to make a measurement with a minimum resolution as fine as 0.5 lx and with a dynamic range as wide as 307,200 lx at the maximum.

There is still left a margin to further raise the maximum measurement level by increasing the frequency of the clock signal CLK and altering the balance between the photodiode PD and the charger/discharger 10. Considering that 300,000 lx corresponds to the illuminance of sun light in the summer, however, the settings specifically described above should offer sufficient performance for measurement of illumination and natural light.

Moreover, with the illuminance sensor 100 of this embodiment, the enhanced minimum resolution of the analog/digital converter included in it allows the detection current level to be reduced. Thus, it is possible to reduce the area of the photodiode PD used as a photoelectric conversion device, and hence to contribute miniaturization of illumination devices and electronic devices. Moreover, reducing the detection current level also allows the measurement range to be slid to the high-illuminance side.

The embodiment described above deals with an example in which the amount of electric charge remaining in the capacitor C1 after the end of the charge period is calculated from the discharge duration of the second discharge circuit 13 by counting the number of discharges performed by the second discharge circuit 13 including the capacitor C1. This, however, is in no way meant to limit the configuration with which to practice the present invention; instead, it is possible to adopt any configuration that can grasp the discharge duration of the second discharge circuit 13.

Figure 4:
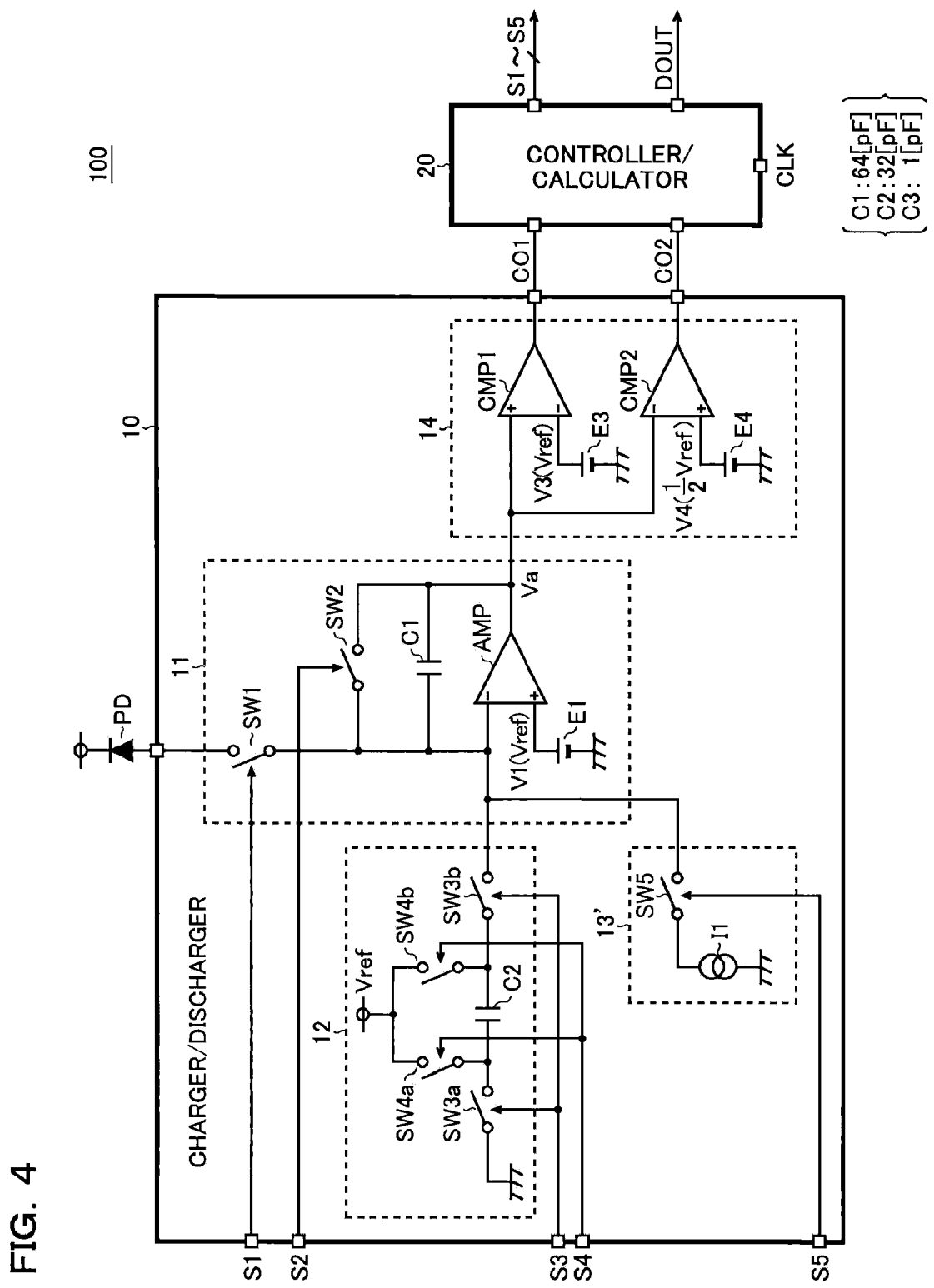
FIG. 4 is a circuit diagram showing an illumination sensor according to the invention, as a second embodiment.

FIG. 4 is a circuit diagram showing an illumination sensor according to the invention, as a second embodiment.

For example, as shown in FIG. 4, a second discharge circuit 13' including a constant current circuit I1 and a switch SW5 may be used. In this configuration, after the end of the charge period of the capacitor C1, the switch SW5 is closed so that the electric charge in the capacitor C1 is discharged by the constant current circuit I1 at a predetermined rate; meanwhile, the time that passes until the electric charge in the capacitor C1 decreases to a predetermined level is measured as by counting pulses in the clock signal CLK.

With this configuration, after coarse measurements are made based on the number of large-scale discharges by the first discharge circuit 12, it is simply necessary to measure, for the small amount of electric charge remaining in the capacitor C1, the discharge duration of the second discharge circuit 13. Thus, even in a case where the input current from the photodiode PD is large, it is possible to shorten the time required to measure it. Moreover, since there is no need to set the current level of the constant current circuit I1 unnecessarily high, it is not necessary to set the frequency of the clock signal CLK unnecessarily high to maintain the minimum resolution of conversion.

Next, as a third embodiment, another illuminance sensor according to the present invention will be described in detail with reference to FIG. 5.

Figure 5:
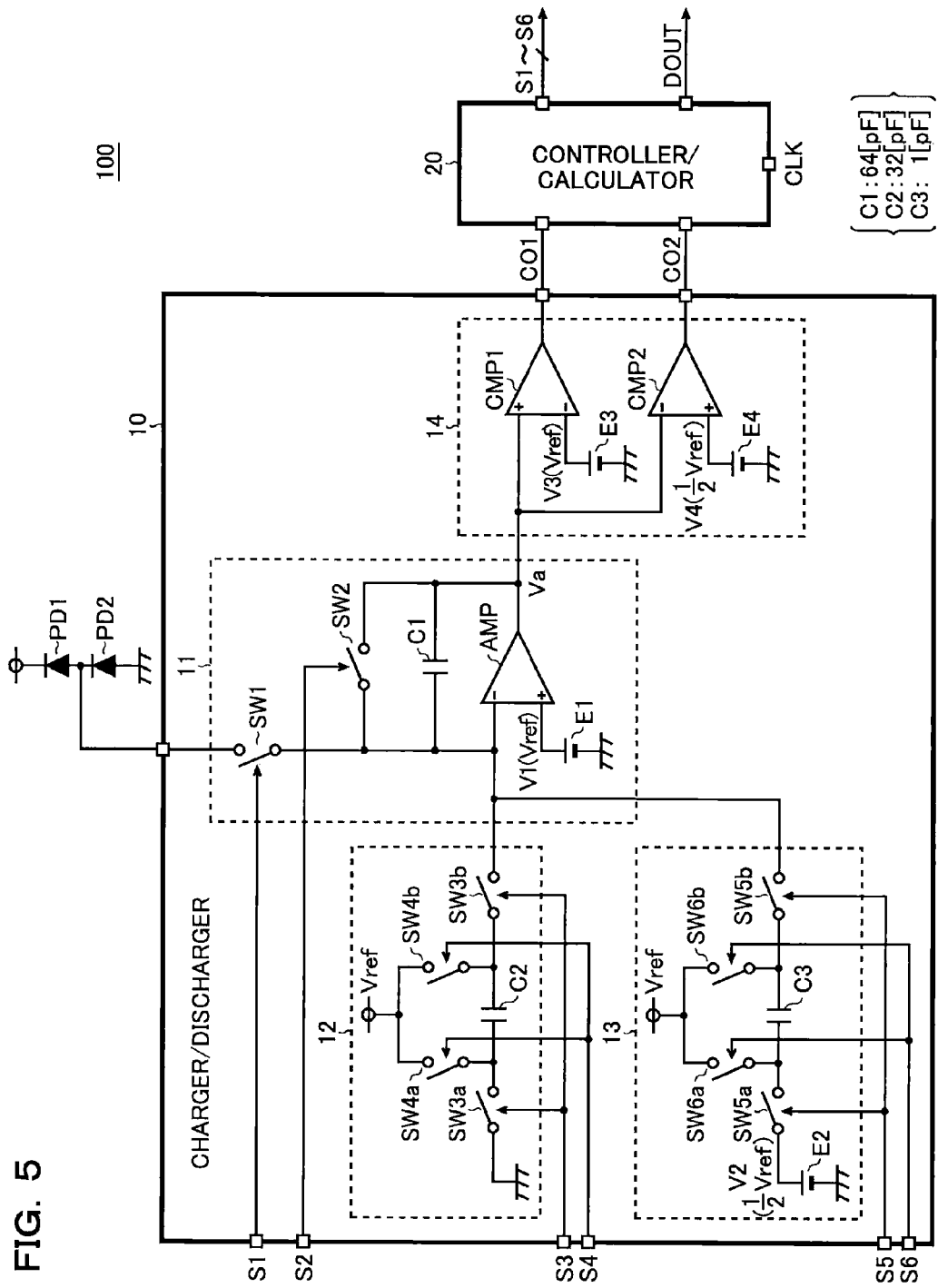
FIG. 5 is a circuit diagram showing an illumination sensor according to the invention, as a third embodiment.

FIG. 5 is a circuit diagram showing an illumination sensor according to the invention, as a third embodiment.

The illuminance sensor 100 of this embodiment has almost the same configuration as those of the first and second embodiments described previously. The unique feature here is that the use of photodiodes PD1 and PD2 having different photodetective characteristics allows measurement of the targeted wavelength alone. In the following description, accordingly, such parts as find their counterparts in the first and second embodiments are identified with reference numerals and symbols common to FIGS. 1 and 4, and no detailed explanation of such parts will be repeated; thus, the following description proceeds with emphasis placed on the features unique to this embodiment.

As shown in FIG. 5, the illuminance sensor 100 of this embodiment includes a photoelectric conversion circuit that has, connected in series between a supply power node and a grounded node, photodiodes PD1 and PD2 having different photodetective characteristics and that outputs, from the node between them, a current obtained by photoelectric conversion of light.

In the illuminance sensor 100 of this embodiment, the analog/digital converter (the charger/discharger 10 and the control calculator 20) receives, as an input current to it, a differential output derived from the node between the photodiodes PD1 and PD2, and yields a digital output according to the illuminance of light having the desired wavelength. This, however, is in no way meant to limit the configuration of the analog/digital converter; instead, it is possible to use an analog/digital converter of any configuration so long as it includes an integrating operational amplifier.

With the photodiodes PD1 and PD2 connected in series as described above, the current level derived from the node between them equals the output current (having a level ii) of the photodiode PD1, whose anode points to the node, minus the output current (having a level i2) of the photodiode PD2, whose cathode points to the node.

For example, suppose that the photodiode PD1 is given a first photodetective characteristic (spectral sensitivity) such that it senses visible and infrared light, and that the photodiode PD2 is given a second photodetective characteristic (spectral sensitivity) such that it senses infrared light. Then, what is derived from the node between them is a differential output (having a level i1-i2) that depends solely on the illuminance of visible light.

Thus, even in a case where a photoelectric conversion device that senses light of a targeted wavelength alone is difficult to form, connecting two photoelectric conversion devices in series and appropriately adjusting the balance of their outputs in the fabrication process makes it possible to measure light having the desired wavelength alone.

Figure 8:
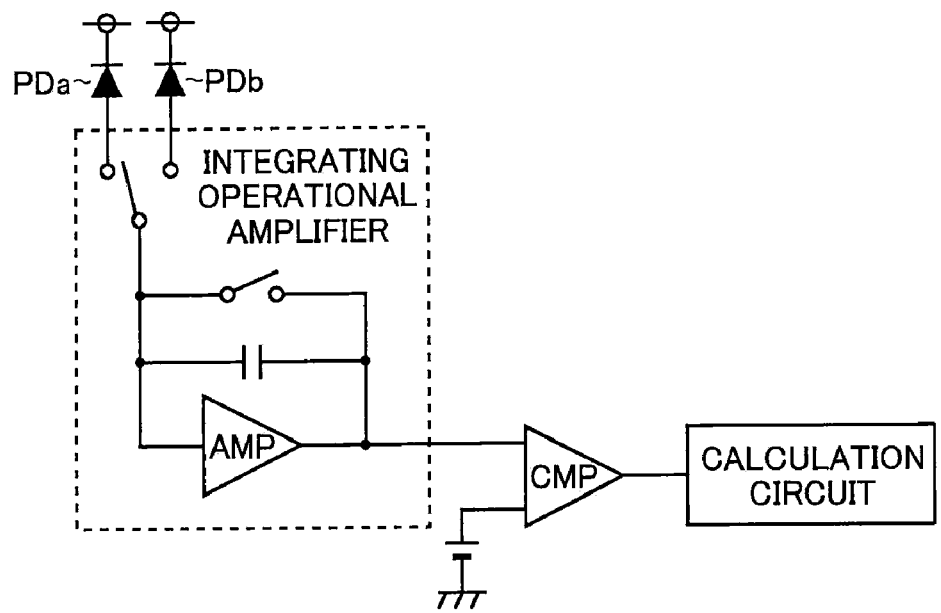
FIG. 8 is a block diagram showing a conventional example of an illuminance sensor.

Moreover, as compared with the conventional configuration shown in FIG. 8 (where photoelectric conversion processing is performed on a time-division basis by use of a plurality of photodiodes and, after analog/digital conversion of their respective output currents, the difference between them is calculated to measure the targeted wavelength alone), the configuration of this embodiment does not require a separate calculation circuit, and is therefore advantageous in achieving cost reduction and mount area reduction.

Moreover, with the configuration of this embodiment, since the differential output from the photodiodes PD1 and PD2 is fed to an analog/digital converter including an integrating operational amplifier, it is possible to obtain a wider input dynamic range.

Moreover, with the configuration of this embodiment, since the photoelectric conversion processing by the photodiodes PD1 and PD2 proceed simultaneously, it is possible to complete measurement of illuminance in half the time required by the conventional configuration shown in FIG. 8. In addition, even if a variation arises in the illuminance of the measurement-target light, it is possible to follow it and yield an accurate calculation result.

Incidentally, when a photoelectric conversion device (photodiode) is connected to the analog/digital converter (the charger/discharger 10 and the control calculator 20) of either of the first and second embodiments, the parasitic capacitance present in the photoelectric conversion device can be filled with the current from the supply power node, and this permits the current outputted from the photoelectric conversion device to rise fast. This is true also in the third embodiment, where two photoelectric conversion devices are connected in series: since as much electric charge as fills the parasitic capacitances present in them both is supplied by the current from the supply power node, it is possible to realize an illuminance sensor with fast response.

Next, with reference to FIGS. 6A and 6B, an electronic device employing an illuminance sensor 100 according to the present invention will be described in detail.

Figure 6A:
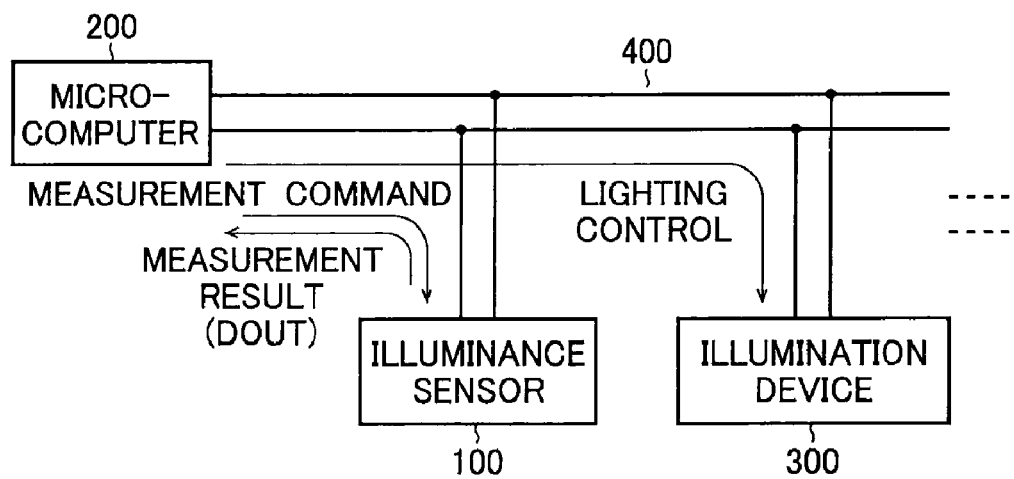
FIGS. 6A and 6B are block diagrams showing an example of an electronic device employing an illuminance sensor 100.
Figure 6B:
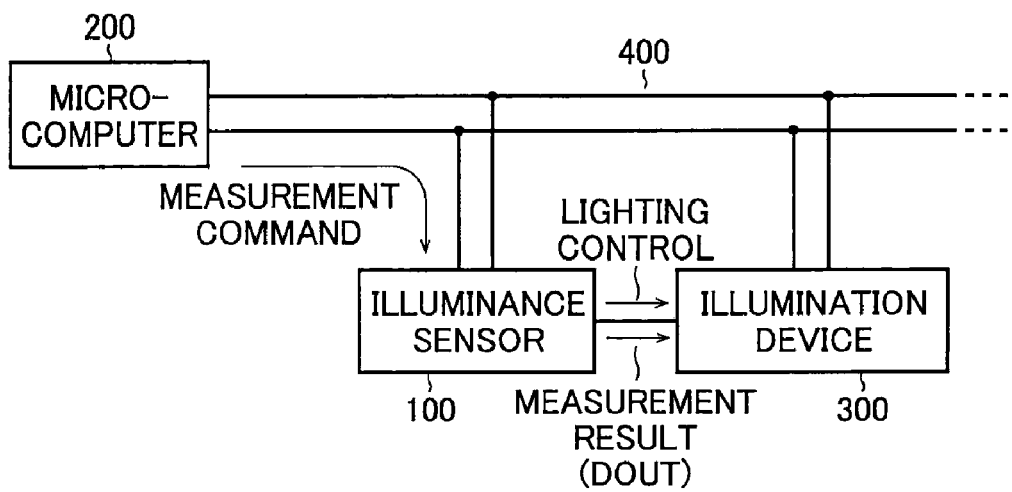
Figure 7:
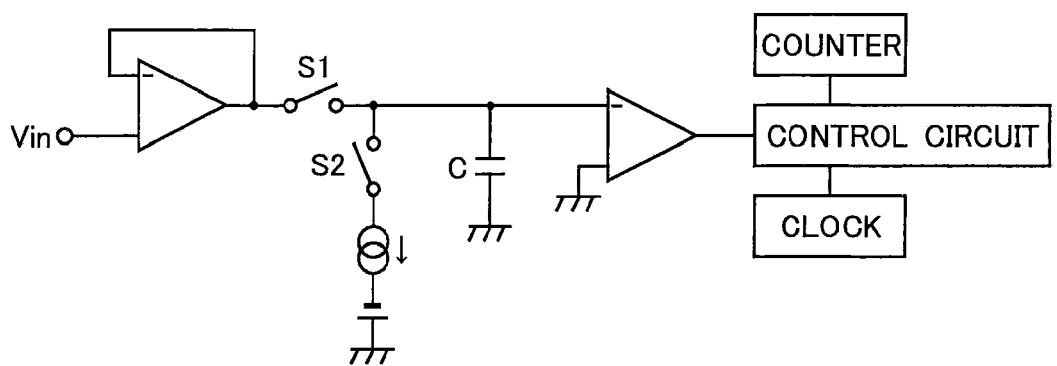
FIG. 7 is a block diagram showing a conventional example of an analog/digital converter.

FIGS. 6A and 6B are block diagrams showing an example of an electronic device employing an illuminance sensor 100.

The electronic device shown in FIGS. 6A and 6B includes: an illuminance sensor 100, which may be any of those described previously; a microcomputer 200 that gives the illuminance sensor 100 a measurement command; an illumination device 300 the lighting of which is controlled according to the measurement result from the illuminance sensor 100; and a bus 400 (for example, an I2C bus) that serves as a signal transfer path among the microcomputer 200, the illuminance sensor 100, and the illumination device 300.

The measurement result (DOUT) from the illuminance sensor 100 may be, as shown in FIG. 6A, returned to the microcomputer 200 so that the microcomputer 200 then controls the lighting of the illumination device 300, or may be, as shown in FIG. 6B, directly fed from the illuminance sensor 100 to the illumination device 300.

The electronic device here is, for example, a cellular phone terminal; the illumination device 300 incorporated in it is, for example, a backlight for a liquid crystal display or for a keypad.

For example, a backlight for a keypad can be so controlled as to be turned on when it is light around and be turned off when it is dark around. For another example, a backlight for a semi-transmissive liquid crystal display can be so controlled as to be dimmed when it is dark around, be made increasingly bright as it becomes lighter around, and be turned off when it is lighter than a certain level around. For yet another example, a backlight for a fully transmissive liquid crystal display can be so controlled as to be increasingly bright as it becomes lighter around.

The embodiments described above deal with examples where an analog/digital converter according to the invention is employed in an illuminance sensor. This, however, is in no ways meant to limit the application of the present invention;

the invention finds wide application in various sensors such as current output sensors other than illuminance sensors.

The present invention may be carried out otherwise than specifically described by way of embodiments above, with any modification and variation made within the spirit of the invention.

For example, although the embodiments described above deal with examples where the ratio of the large-scale discharging ability to the small-scale discharging ability is set at 64:1, this is in no way meant to limit the configuration with which to practice the present invention; by adjusting the balance between the two discharging abilities, it is possible to easily adjust the input dynamic range and the minimum resolution. For example, by relatively increasing the large-scale discharging ability, it is possible to raise the upper limit of the input dynamic range; by relatively reducing the small-scale discharging ability, it is possible to enhance the minimum resolution.

Although the embodiments described above deal with examples where the threshold voltage (the fourth standard voltage V4) with which the output voltage Va of the operational amplifier AMP is compared to judge whether or not to discharge on a large scale is set equal to Vref/2, this is in no way meant to limit the configuration with which to practice the present invention; the threshold voltage may be adjusted appropriately. Incidentally, the reason that this threshold voltage is set equal to Vref/2 in the embodiments described above is to secure a margin to allow for cases in which the incoming light is so intense that the output voltage Va becomes lower than the threshold voltage.

The benefits of the present invention can be summarized as follows. With an analog/digital converter according to the invention, it is possible to achieve a wider input dynamic range combined with an enhanced minimum resolution without a need for complicated external control; in addition, it is possible to shorten the measurement time.

Moreover, with an illuminance sensor according to the invention, the enhanced minimum resolution of the analog/digital converter included in it allows the detection current level to be reduced; thus, it is possible to reduce the area of a photodiode used as a photoelectric conversion device, and hence to contribute to miniaturization of illumination devices and electronic devices employing it.

Moreover, with an illuminance sensor according to the invention, it is possible to measure a target wavelength alone accurately with no increase in circuit scale or in measurement time.

From the perspective of industrial applicability, the present invention is useful in widening the input dynamic range, enhancing the minimum resolution, and shortening the measurement time of, for example, digital-output illuminance sensors.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. An analog/digital converter comprising:
    a charge circuit having a charge capacitor storing an electric charge commensurate with an input current; and
    first and second discharge circuits discharging the electric charge stored in the charge capacitor,
    wherein
        while the charge capacitor is charged for a predetermined charge period, every time a predetermined amount of electric charge is stored in the charge capacitor, the electric charge stored in the charge capacitor is discharged by the first discharge circuit and,
        after the charge period, the electric charge remaining in the charge capacitor is discharged by the second discharge circuit, and
        based on a number of discharges performed by the first discharge circuit and a discharge duration of the second discharge circuit, the analog/digital converter outputs a digital value of a voltage commensurate with an amount of electric charge with which the charge capacitor has been charged.

2. The analog/digital converter according to claim 1, wherein the second discharge circuit has a second discharge capacitor, and the discharge duration is based on a number of discharges performed with the second discharge capacitor.

3. The analog/digital converter according to claim 1, wherein the second discharge circuit is a constant current circuit, and the discharge duration equals a time required by the constant current circuit to make a charge voltage of the charge capacitor equal to a predetermined voltage.

4. The analog/digital converter according to claim 2, wherein
    the charge circuit stores the electric charge commensurate with the input current by use of the charge capacitor for the predetermined charge period,
    the first discharge circuit discharges the electric charge stored in the charge capacitor by use of a first discharge capacitor every time the amount of electric charge stored in the charge capacitor reaches a predetermined threshold level during the charge period, and
    the second discharge circuit, after an end of the charge period, discharges the electric charge remaining in the charge capacitor until the amount of electric charge in the charge capacitor decreases to a predetermined level, the second discharge circuit doing so by use of a second discharge capacitor having a smaller-scale discharging ability than the first discharge capacitor and in steps, discharging a predetermined amount of electric charge in each step.

5. The analog/digital converter according to claim 4, further comprising:
    a controller/calculator controlling charging and discharging performed by the charge circuit and the first and second discharge circuits, the controller/calculator calculating a charge amount of the charge circuit based on a total number of discharges performed by the first and second discharge circuits and yielding a digital output reflecting a result of the calculation.

6. The analog/digital converter according to claim 5, wherein
    the charge circuit comprises:
    an operational amplifier;
    the charge capacitor of which a first end is connected to an inverting input terminal of the operational amplifier and of which a second end is connected to an output terminal of the operational amplifier;
    a first constant voltage source applying a first standard voltage having a predetermined voltage level to the non-inverting input terminal of the operational amplifier;
    a first switch opening and closing a path between an input node via which the input current is fed in and the first end of the charge capacitor; and
    a second switch short-circuiting across the charge capacitor;

the first discharge circuit comprises:
a first discharge capacitor having a capacitance 1/m (m≧1) as high as a capacitance of the charge capacitor;
third switches respectively opening and closing a path between a first end of the first discharge capacitor and a grounded node and a path between a second end of the first discharge capacitor and the inverting input terminal of the operational amplifier; and
fourth switches respectively opening and closing paths between each end of the first discharge capacitor and a node to which the first standard voltage is applied, and
the second discharge circuit comprises:
a second discharge capacitor having a capacitance 1/n (n>m) as high as the capacitance of the charge capacitor;
fifth switches respectively opening and closing a path between a first end of the second discharge capacitor and a node to which a second standard voltage is applied and a path between a second end of the second discharge capacitor and the inverting input terminal of the operational amplifier; and
sixth switches respectively opening and closing paths between each end of the second discharge capacitor and the node to which the first standard voltage is applied.

7. The analog/digital converter according to claim 6, wherein the second discharge circuit further comprises:
a second constant voltage source generating the second standard voltage having a voltage level 1/k (k>1) as high as the first standard voltage.

8. The analog/digital converter according to claim 7, further comprising:
a comparison circuit comparing an output voltage of the operational amplifier with each of third and fourth standard voltages,
wherein the controller/calculator open and close the first to sixth switches according to a predetermined clock signal and an output signal of the comparison circuit.

9. An illuminance sensor comprising:
a photoelectric conversion device or photoelectric conversion circuit converting light into an electric current;
an analog/digital converter receiving, as an input current thereto, an output of the photoelectric conversion device or photoelectric conversion circuit and yielding a digital output according to illuminance,
wherein the analog/digital converter comprises:
a charge circuit having a charge capacitor storing an electric charge commensurate with an input current; and
first and second discharge circuits discharging the electric charge stored in the charge capacitor,
wherein
while the charge capacitor is charged for a predetermined charge period, every time a predetermined amount of electric charge is stored in the charge capacitor, the electric charge stored in the charge capacitor is discharged by the first discharge circuit and,
after the charge period, the electric charge remaining in the charge capacitor is discharged by the second discharge circuit, and
based on a number of discharges performed by the first discharge circuit and a discharge duration of the second discharge circuit, the analog/digital converter outputs a digital value of a voltage commensurate with an amount of electric charge with which the charge capacitor has been charged.

10. The illuminance sensor according to claim 9, wherein the photoelectric conversion circuit has first and second photoelectric conversion devices having different photodetective characteristics connected in series and outputs, from a node between the first and second photoelectric conversion devices, a current obtained by photoelectric conversion of light.

11. An electronic device comprising an illumination device of which lighting is controlled according to a result of measurement by an illuminance sensor, wherein
the illuminance sensor comprises:
a photoelectric conversion device or photoelectric conversion circuit converting light into an electric current;
an analog/digital converter receiving, as an input current thereto, an output of the photoelectric conversion device or photoelectric conversion circuit and yielding a digital output according to illuminance, and
the analog/digital converter comprises:
a charge circuit having a charge capacitor storing an electric charge commensurate with an input current; and
first and second discharge circuits discharging the electric charge stored in the charge capacitor,
wherein
while the charge capacitor is charged for a predetermined charge period, every time a predetermined amount of electric charge is stored in the charge capacitor, the electric charge stored in the charge capacitor is discharged by the first discharge circuit and,
after the charge period, the electric charge remaining in the charge capacitor is discharged by the second discharge circuit, and
based on a number of discharges performed by the first discharge circuit and a discharge duration of the second discharge circuit, the analog/digital converter outputs a digital value of a voltage commensurate with an amount of electric charge with which the charge capacitor has been charged.

12. An illumination device of which lighting is controlled according to a result of measurement by an illuminance sensor, wherein
the illuminance sensor comprises:
a photoelectric conversion device or photoelectric conversion circuit converting light into an electric current;
an analog/digital converter receiving, as an input current thereto, an output of the photoelectric conversion device or photoelectric conversion circuit and yielding a digital output according to illuminance, and
the analog/digital converter comprises:
a charge circuit having a charge capacitor storing an electric charge commensurate with an input current; and
first and second discharge circuits discharging the electric charge stored in the charge capacitor,
wherein
while the charge capacitor is charged for a predetermined charge period, every time a predetermined amount of electric charge is stored in the charge capacitor, the electric charge stored in the charge capacitor is discharged by the first discharge circuit and,
after the charge period, the electric charge remaining in the charge capacitor is discharged by the second discharge circuit, and
based on a number of discharges performed by the first discharge circuit and a discharge duration of the second discharge circuit, the analog/digital converter outputs a digital value of a voltage commensurate with an amount of electric charge with which the charge capacitor has been charged.

* * * * *